United States Patent [19]

Todd et al.

[11] Patent Number: 4,700,362
[45] Date of Patent: Oct. 13, 1987

[54] A-D ENCODER AND D-A DECODER SYSTEM

[75] Inventors: Craig C. Todd, Muir Beach; Kenneth J. Gundry, San Francisco, both of Calif.

[73] Assignee: Dolby Laboratories Licensing Corporation, San Francisco, Calif.

[21] Appl. No.: 642,045

[22] Filed: Aug. 21, 1984

Related U.S. Application Data

[63] Continuation-in-part of Ser. No. 540,195, Oct. 7, 1983, abandoned, and a continuation-in-part of Ser. No. 540,421, Oct. 7, 1983, abandoned.

[51] Int. Cl.[4] ............................................. H04B 14/06
[52] U.S. Cl. ................................... 375/30; 332/11 D; 381/29
[58] Field of Search ....................... 375/27, 28, 29, 30, 375/31, 32, 122; 340/347 AD, 347 DA; 332/11 D; 381/29, 30, 31

[56] References Cited

U.S. PATENT DOCUMENTS

| | | | |
|---|---|---|---|
| 2,605,361 | 7/1952 | Cutler | 375/28 |
| 2,669,608 | 2/1954 | Goodall | 375/26 |
| 2,686,869 | 8/1954 | Bedford | 375/26 |
| 2,724,740 | 11/1955 | Cutler | 375/32 |
| 2,897,275 | 7/1959 | Bowers | 370/7 |
| 2,927,962 | 3/1960 | Cutler | 375/26 |
| 3,026,375 | 3/1962 | Graham | 375/32 |
| 3,048,781 | 8/1962 | Glaser | 375/26 |
| 3,343,087 | 9/1967 | Helms | 375/26 |
| 3,382,438 | 5/1968 | Geller | 375/26 |
| 3,393,364 | 7/1968 | Fine | 375/31 |
| 3,461,244 | 8/1969 | Brolin | 370/7 |
| 3,490,045 | 1/1970 | De Boer et al. | 375/30 |
| 3,496,468 | 2/1970 | Kaneko et al. | 375/32 |
| 3,497,624 | 2/1970 | Brolin | 375/32 |
| 3,500,441 | 3/1970 | Brolin | 370/7 |
| 3,518,548 | 6/1970 | Greekes et al. | 375/33 |

(List continued on next page.)

FOREIGN PATENT DOCUMENTS

| | | |
|---|---|---|
| 0046682 | 9/1983 | European Pat. Off. . |
| 2341381 | 8/1973 | Fed. Rep. of Germany . |
| 2303497 | 1/1974 | Fed. Rep. of Germany . |
| 2420519 | 4/1974 | Fed. Rep. of Germany . |

(List continued on next page.)

OTHER PUBLICATIONS

Dodds et al, "Error Tolerant Adaptive Algorithms for Delta-Modulation Coding", IEEE Transactions on Communications, vol. COM-28, No. 3, Mar. 1980, pp. 385–391.

(List continued on next page.)

*Primary Examiner*—Robert L. Griffin
*Assistant Examiner*—Stephen Chin
*Attorney, Agent, or Firm*—Majestic, Gallagher, Parsons & Siebert

[57] ABSTRACT

An encoder converts an analog input signal to a digital signal. The encoder comprises a circuit for generating a control signal with a predetermined bandwidth from the input analog signal. The control signal indicates the desired optimum step-size to be applied in the encoder. The encoder further comprises a converter for converting the analog input signal to a digital signal. The converter is responsive to the control signal representing step-size so that the digital signal will be generated in accordance with the step-size information. Since the generation of a limited bandwidth control signal requires time, the encoder also includes a circuit for introducing time delay to the analog input signal, so that the delayed input signal reaches the converter when the control signal is available for digital encoding.

A decoder generates an analog output signal from a digital signal received from an encoder through a transmission medium. The digital signal received includes a digital representation of an analog input signal to the encoder and step-size information which was used to digitally encode the analog signal in the encoder. The decoder comprises a converter responsive to a second control signal of limited bandwidth derived from the step-size information for generating from the digital representation an analog output signal. The analog output signal so generated is similar to the input analog signal.

56 Claims, 8 Drawing Figures

U.S. PATENT DOCUMENTS

| | | |
|---|---|---|
| 3,560,659 | 2/1971 | Greekes et al. .......................... 370/7 |
| 3,564,415 | 2/1971 | Brolin et al. ........................... 375/32 |
| 3,568,061 | 3/1971 | Brolin ................................... 375/32 |
| 3,568,062 | 3/1971 | Brolin ................................... 375/30 |
| 3,609,551 | 9/1971 | Brown ................................... 375/32 |
| 3,621,396 | 11/1971 | Daugherty ............................ 375/32 |
| 3,628,148 | 12/1971 | Brolin ................................... 375/32 |
| 3,631,520 | 12/1971 | Atal ...................................... 375/31 |
| 3,646,442 | 2/1972 | Kotch ................................... 370/30 |
| 3,699,566 | 10/1972 | Schindler .............................. 375/32 |
| 3,703,688 | 11/1972 | Flanagan .............................. 375/32 |
| 3,706,944 | 12/1972 | Tewksbury ............................ 375/30 |
| 3,727,135 | 4/1973 | Holzer .................................. 375/32 |
| 3,745,562 | 7/1973 | Rosenbaum ................. 340/347 AD |
| 3,784,922 | 1/1974 | Blahut .................................. 375/32 |
| 3,806,806 | 4/1974 | Brolin ................................... 375/30 |
| 3,815,033 | 6/1974 | Tewksbury ............................ 375/32 |
| 3,823,376 | 8/1977 | Greefkes et al. ....................... 375/32 |
| 3,857,111 | 12/1974 | Deschenes et al. ............... 332/11 D |
| 3,899,754 | 8/1975 | Brolin .............................. 332/11 D |
| 3,911,363 | 10/1975 | Patten .................................. 375/30 |
| 3,913,016 | 10/1975 | Candy .................................. 375/27 |
| 3,916,314 | 10/1975 | Franaszek et al. ..................... 375/30 |
| 3,918,042 | 11/1975 | Werner ....................... 340/347 AD |
| 3,922,606 | 11/1975 | Nordling .............................. 375/30 |
| 3,925,731 | 12/1975 | Brainard et al. ....................... 375/30 |
| 3,956,700 | 5/1976 | Condon ................................ 375/33 |
| 3,971,987 | 7/1976 | Carrubba et al. ...................... 375/31 |
| 3,973,199 | 8/1976 | Widmer ................................ 375/26 |
| 3,979,676 | 9/1976 | Poma .................................... 375/32 |
| 3,980,953 | 9/1976 | Nance et al. .......................... 375/29 |
| 3,995,218 | 11/1976 | Moriya et al. ......................... 375/30 |
| 4,025,852 | 5/1977 | Ching ................................... 375/33 |
| 4,039,949 | 8/1977 | Eggermont ............................ 375/30 |
| 4,039,955 | 8/1977 | Eggermont ............................ 375/28 |
| 4,059,800 | 11/1977 | Jones, Jr. ................................. 370/7 |
| 4,071,825 | 1/1978 | McGuffin .............................. 375/29 |
| 4,100,493 | 7/1978 | Dijkmans et al. ..................... 375/30 |
| 4,101,881 | 7/1978 | De Freitas ........................ 332/11 D |
| 4,109,203 | 8/1978 | Eggermont et al. ................... 375/30 |
| 4,110,705 | 8/1978 | Crouse ............................. 332/11 D |
| 4,122,300 | 10/1978 | Buslgny et al. ........................ 375/28 |
| 4,123,709 | 10/1978 | Dodds et al. .......................... 375/30 |
| 4,151,517 | 4/1979 | Kelley ........................ 340/347 AD |
| 4,169,219 | 9/1979 | Beard .................................... 333/14 |
| 4,190,801 | 2/1980 | De Freitas ............................. 375/30 |
| 4,208,740 | 6/1980 | Yin et al. ............................... 375/30 |
| 4,215,311 | 7/1980 | Kittel et al. ...................... 332/11 D |
| 4,233,684 | 11/1980 | Eggermont ............................ 375/30 |
| 4,251,804 | 2/1981 | Scardina et al. ................. 332/11 D |
| 4,254,502 | 3/1981 | De Freitag et al. ................... 375/30 |
| 4,264,974 | 4/1981 | Crouse .................................. 375/32 |
| 4,287,595 | 9/1981 | Meyers ............................ 332/11 D |
| 4,305,050 | 12/1981 | De Freitas ....................... 332/11 D |
| 4,313,204 | 1/1982 | De Freitas ....................... 332/11 D |
| 4,352,191 | 9/1982 | Un ........................................ 375/30 |
| 4,384,278 | 5/1983 | Benjamin .................... 340/347 AD |
| 4,411,003 | 10/1983 | Su ......................................... 375/33 |
| 4,507,791 | 3/1985 | Gundry ................................. 375/27 |

FOREIGN PATENT DOCUMENTS

| | | |
|---|---|---|
| 2409574 | 11/1975 | Fed. Rep. of Germany . |
| 2551387 | 11/1975 | Fed. Rep. of Germany . |
| 82/04508 | 12/1982 | World Int. Prop. O. . |
| 1108413 | 4/1968 | United Kingdom . |
| 1520264 | 8/1978 | United Kingdom . |
| 1567283 | 5/1980 | United Kingdom . |
| 2076240 | 11/1981 | United Kingdom . |
| 2119189 | 11/1983 | United Kingdom . |

OTHER PUBLICATIONS

Flood & Hawksford, "Adaptive Delta-Sigma Modulation Using Pulse Grouping Techniques.

Zetterberg, "Adaptive Delta Modulation with Delayed Decision", IEEE Transaction on Communications, vol. COM-22, No. 9, pp. 1195-1198, 9-1974.

Jayant, "Digital Coding of Speech Waveforms PCM, DPCM and DM Quantizer", Proc. IEEE, vol. 62, pp. 611-632, May 1974.

Jayant, "Adaptive Delta Modulation with One-Bit Memory", The Bell Lab System Technical Journal, vol. 49, Mar. 1970, No. 3.

Croisier, "Progress in PCM and Delta Modulation: Block Companded Coding of Speech Signal, IBM, France Center & Etudes et Recherches, 1974, Zurich Seminar.

Stephen et al, "Companded Delta Modulation for Telephone", IEEE Transactions on Communications Technology, Com-16, 2-1968.

Shugar Chan, "Delta Modulation with Slope-Overload Prediction", Electronic Letter, 30 Apr. 1970, vol. 6, No. 9.

Tomozawa et al, "Companded Delta Modulation for Telephone Transmission", IEEE Transactions on Communication Technology, Feb. 1968.

Noll, "Adaptive Quantization in Speed Coding System", Proc. IEEE Zurich Seminar on Digital Commun., Mar. 12-15-1975.

(List continued on next page.)

OTHER PUBLICATIONS

Connor, "Interface Coding for Picture Transmission", Proc. IEEE, vol. 60, pp. 779–791, Jul. 1972.

Oliver, "An Adaptive Delta Modulator with Overshoot Suppression for Video Signals", IEEE Transactions on Communication, Mar. 1973.

Dunik, "Overload Noise Reduction in Adaptive Delta Modulators", IBM Technical Disclosure Bulletin, vol. 22, No. 5, Oct. 1979.

Abate, "Linear and Adaptive Delta Modulation", Proc. IEEE, vol. 55, pp. 298–308, Mar. 1967.

Schindler, "Linear Non Linear and Adaptive Delta Modulation", IEEE Transaction on Communication, Nov. 1974.

Jayant, "Step-Size Transmitting Differential Coders for Mobile Telephone", The Bell System Technical Journal, vol. 54, No. 9, Nov. 1975.

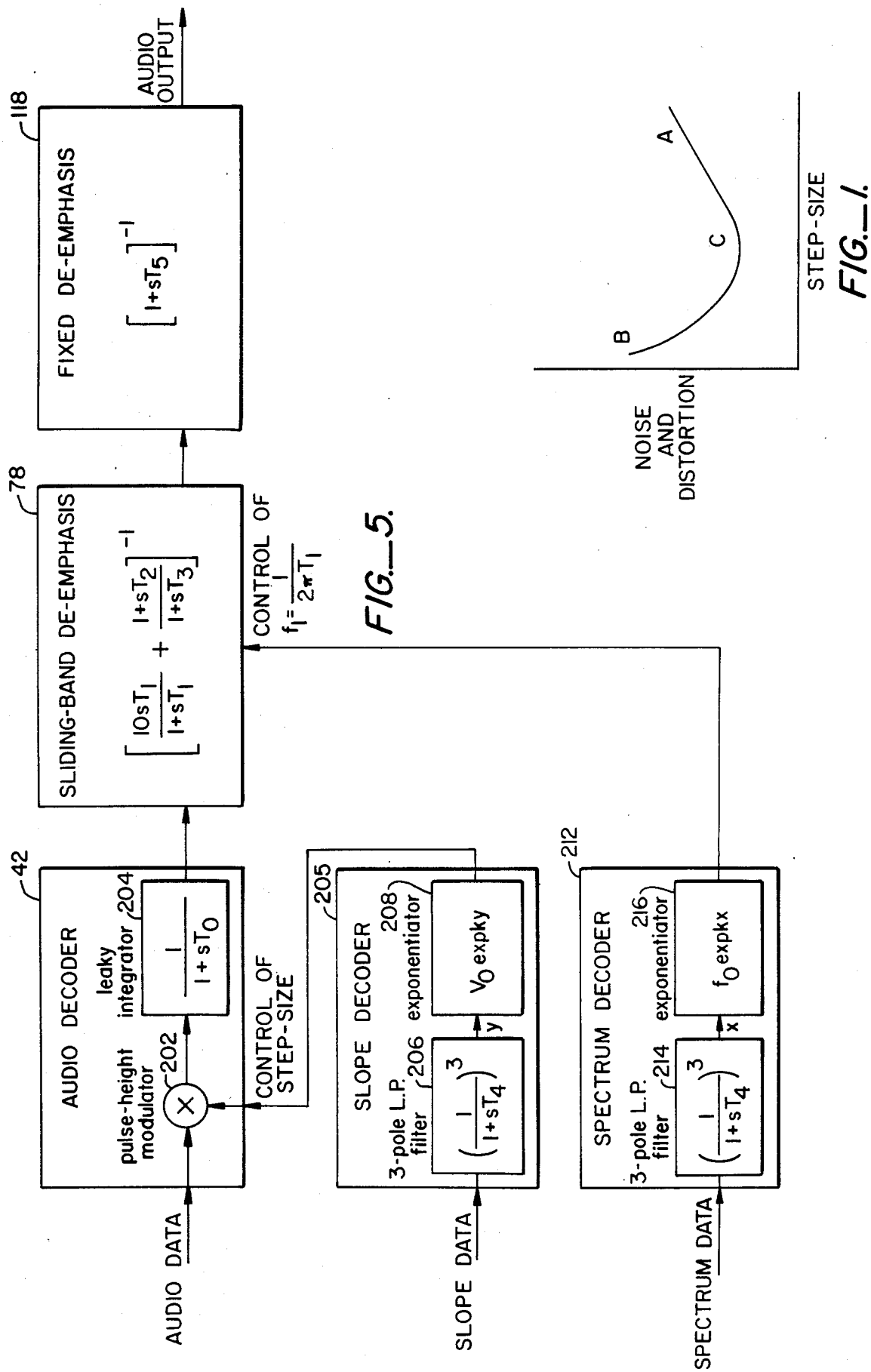

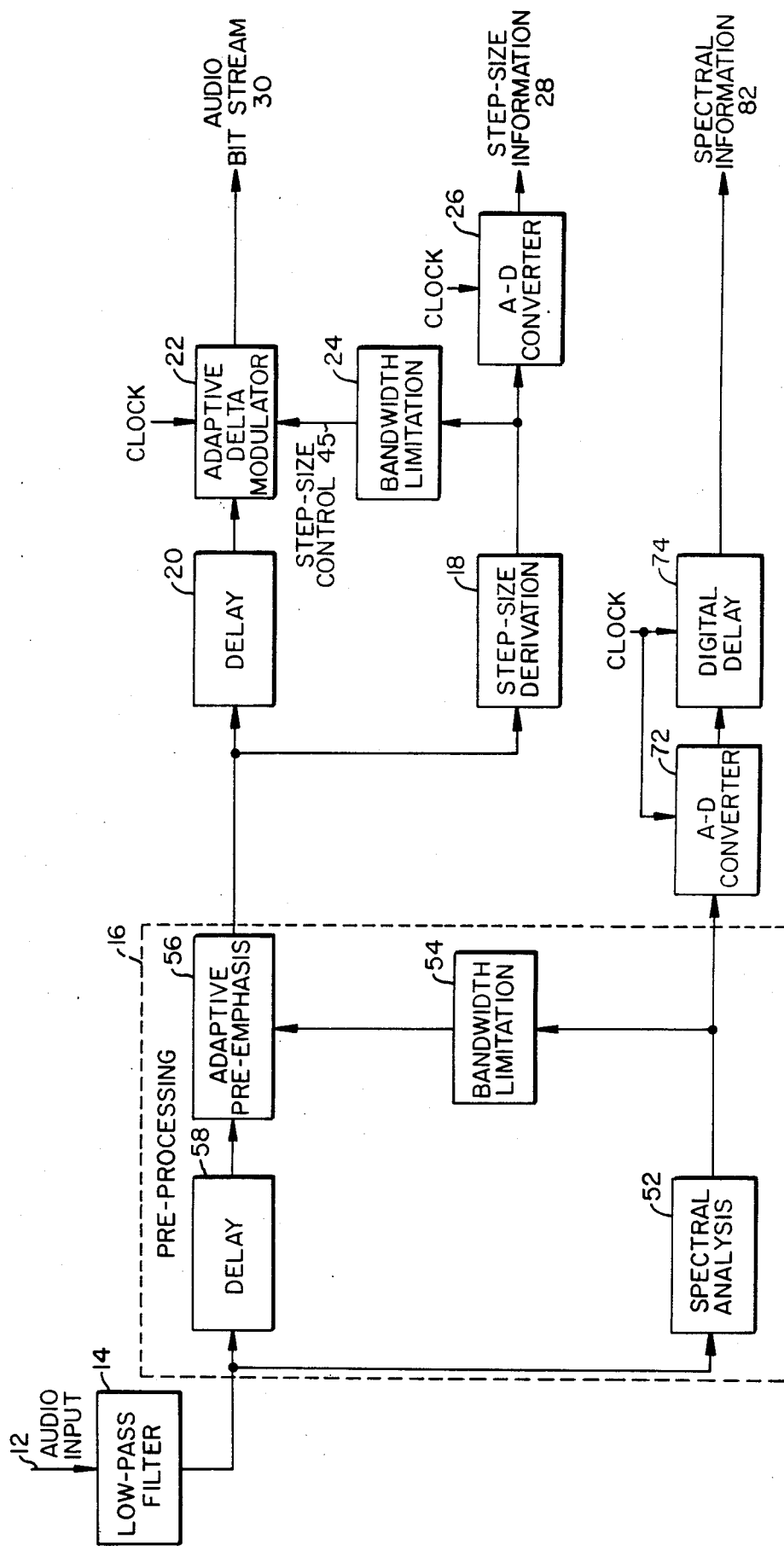
FIG._2A.

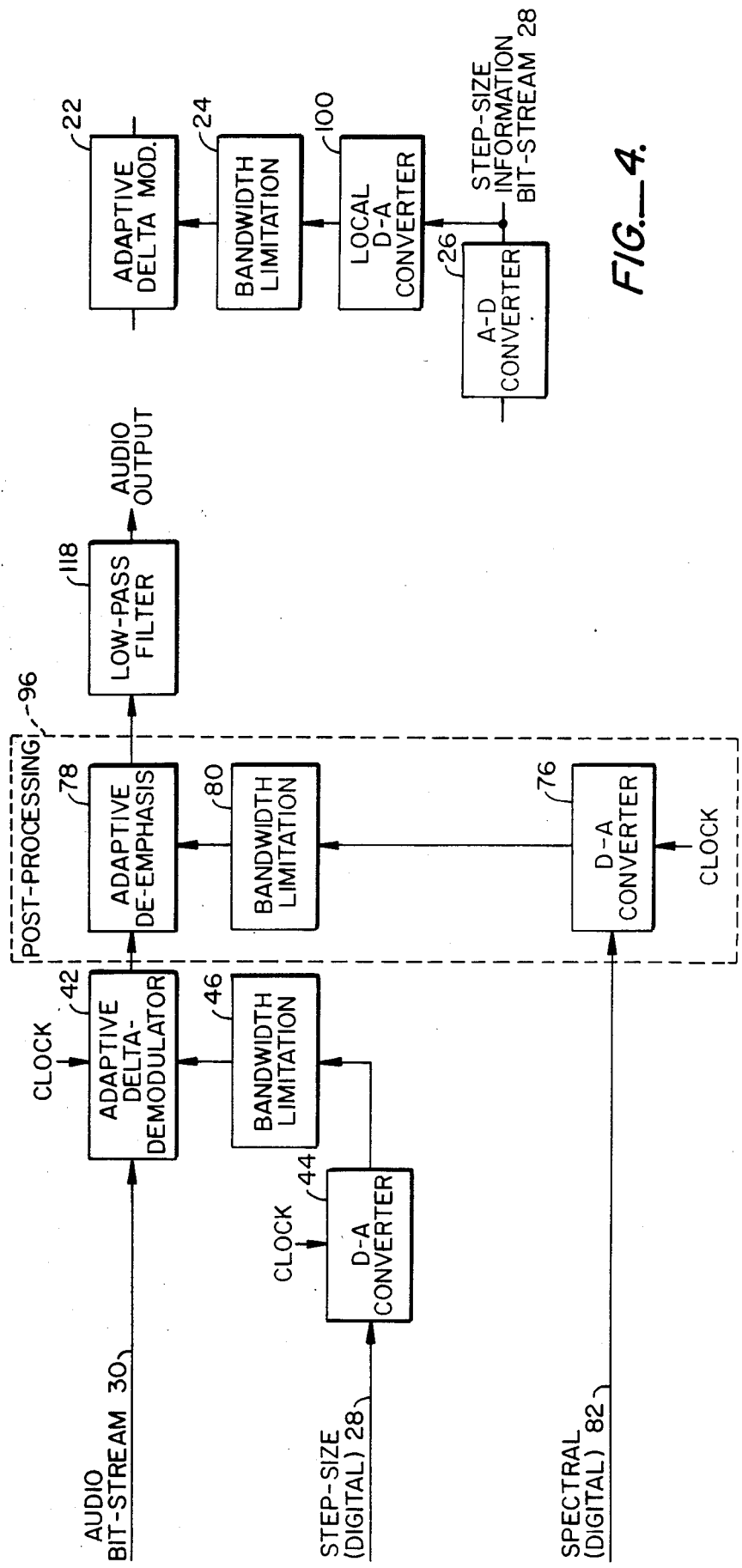

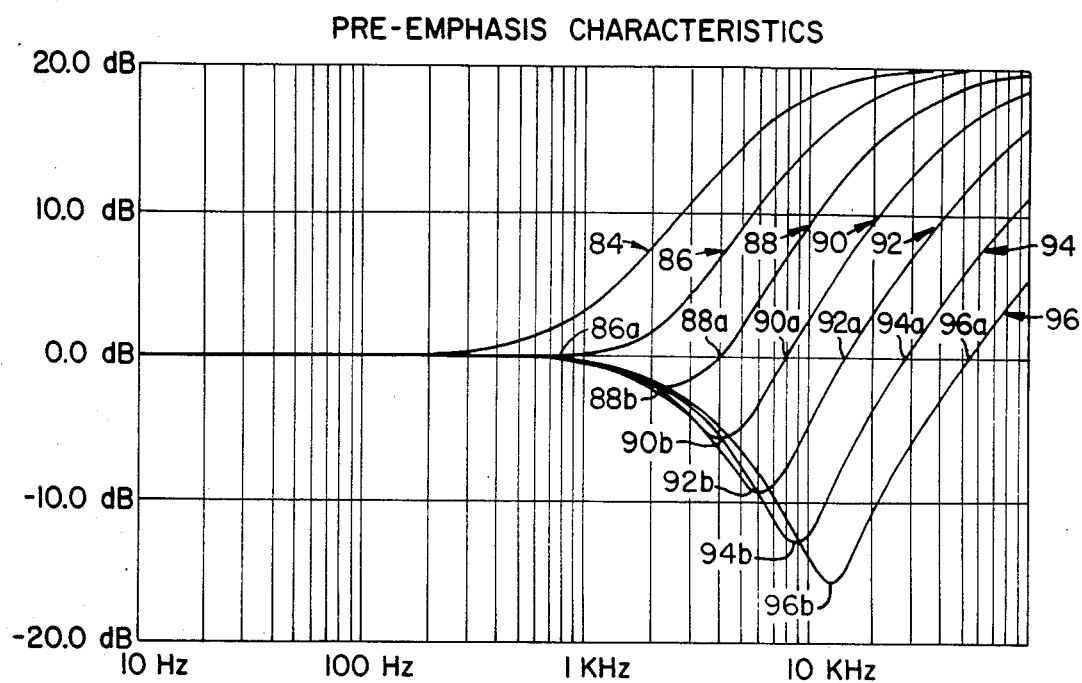
FIG._3A.
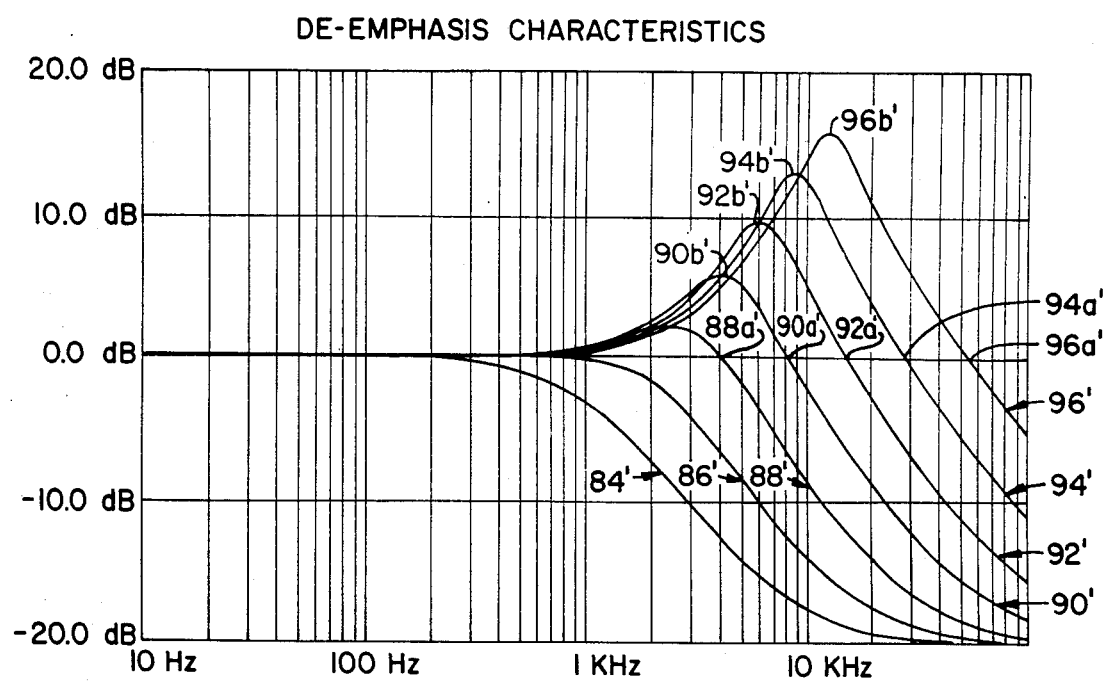
FIG._3B.

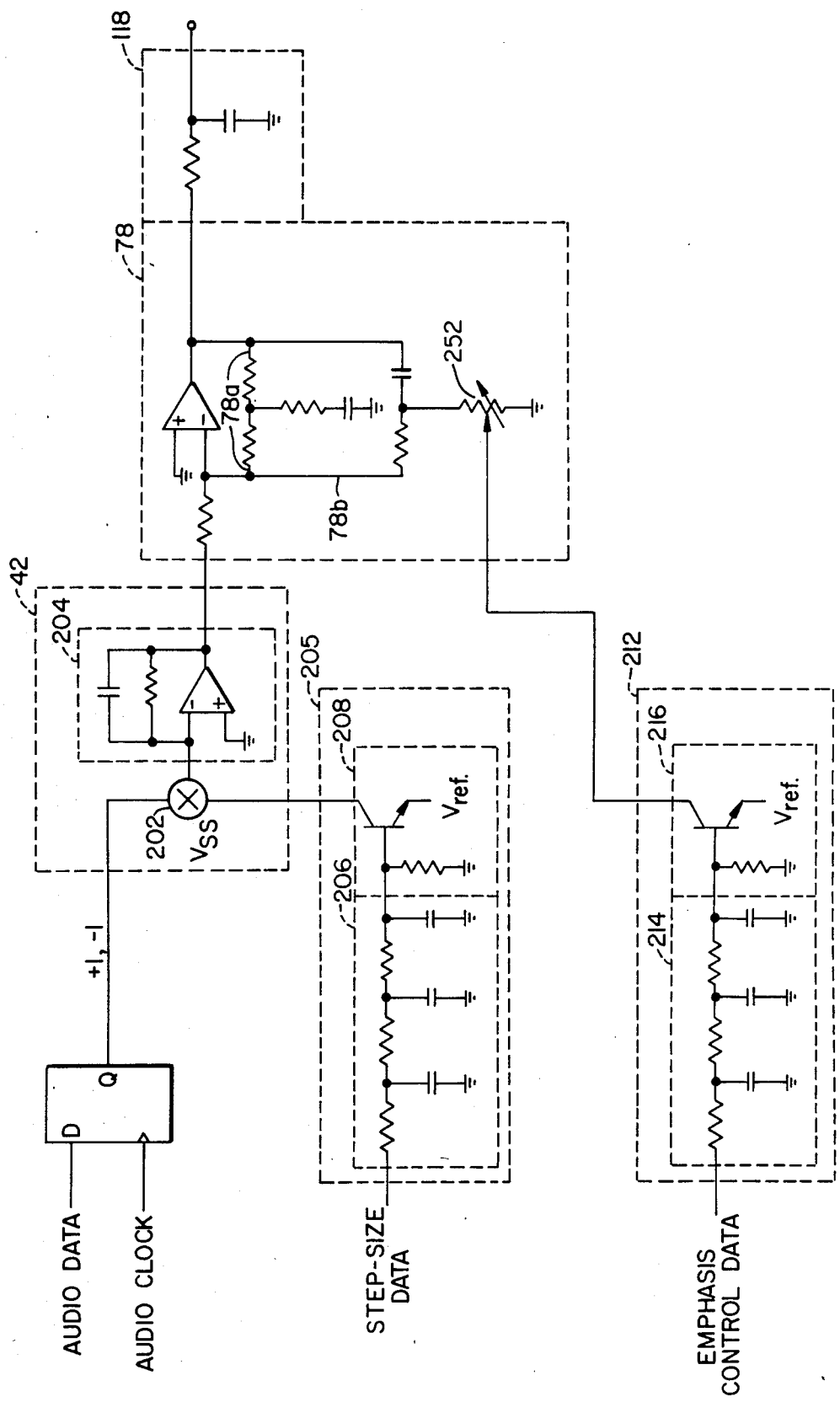
FIG._6.

4,700,362

A-D ENCODER AND D-A DECODER SYSTEM

CROSS REFERENCE TO RELATED APPLICATIONS

This application is a continuation-in-part application of two parent applications: Ser. No. 540,195 entitled "A-D Encoder and D-A Decoder System" and Ser. No. 540,421 entitled "Spectral Emphasis and De-emphasis", both filed Oct. 7, 1983 and now abandoned by Craig C. Todd and Kenneth James Gundry. This application is also related to another application filed herewith and referred to below as the companion application: "Spectral Emphasis and De-emphasis" by Kenneth James Gundry and Craig C. Todd, which is a continuation-in-part application also of the two parent applications referenced above and filed Oct. 7, 1983. This application is also related to an application entitled "Analog and Digital Signal Apparatus" by Kenneth James Gundry, filed Sept. 7, 1982, Ser. No. 415,028.

BACKGROUND OF THE INVENTION

This invention relates in general to the processing and transmission of electrical signals and in particular to circuits for converting analog signals to digital signals and then recovering the analog signals from the digital signals.

Many digital systems have been proposed for transmitting electrical signals such as in the delivery of audio signals from a broadcast center to the consumer. One proposed system employs linear pulse code modulation (PCM) in which the quantizing step-sizes remain constant throughout the transmission. To preserve the quality of signals transmitted and in particular to retain the resolution for small signals, at least 13 binary bits per sample are required, while 14 to 16 bit systems are commonly used. For broadcasting of audio signals, the bandwidth is typically 15 kHz. Thus linear PCM systems require high bit rates of transmission (a minimum of about 32 kHz$\times$13 bits i.e. 416 kbit per second even without any provision for error identification or correction). A linear PCM system must also employ high precision components and is therefore expensive.

To reduce transmission bit rate, some conventional PCM systems have employed digital companding. While the transmission bit rate can be reduced somewhat, precision 13 or 14 bit converters must still be used and digital companding further adds complexity and cost to the circuitry. Hence linear or digitally companded PCM systems are unattractive for cost sensitive applications such as use in the home.

Delta modulation systems are attractive for signal transmission because of cost savings in their hardware; delta modulation systems employ simple circuits and do not require close component tolerance. Delta modulation systems are also inherently less disturbed by uncorrected transmission errors. Linear delta modulation systems however require much higher bit rates than PCM systems to achieve the same quality transmission and are therefore unattractive.

Bit-rate reduction has also been applied to delta modulation systems by varying the effective quantizing step-size. Such delta modulation systems are known as adaptive delta modulation (ADM) systems. Digital companding in multi-level PCM systems is performed usually by quantizing to the highest degree of resolution for small signals and then reducing the resolution for large amplitude signals. With ADM systems whose bit-streams have only two states, the adaptation is usually performed by directly altering the quantizing increment between those states either on an instantaneous (sample to sample) basis, on a block basis ("near-instantaneous") or at a syllabic rate.

In ADM, the adaptation can be considered equivalent to multiplication or division of the audio signal by the step-size. It is well known from modulation theory that the act of multiplying or dividing an analog signal by another signal will cause the resulting product signal to include modulation sidebands which contaminate the original analog signal. In an ADM encoder the digital output is a representation of this product signal. In order to eliminate these modulation sidebands and to reconstruct the original audio signal from the digital representation, a complementary process must be performed in the adaptive delta-demodulation, that is another multiplication or division. It is apparent that to reconstruct the audio perfectly, the multipliers or dividers in the encoder and decoder need to be 'perfect' (or at least identically imperfect) and the multiplicative signals must also be precisely equal. The mismatch inherent in real circuits will result in the reconstructed audio having a spectrum differing from the original. The frequencies of the spectral difference will depend on the spectrum of the modulating or control signals, and the amplitude of the differences will depend on the magnitude of the circuit mismatches.

In ADM systems employing instantaneous or near-instantaneous adaptation, the adaptation is usually output controlled (operating from the output bit stream). The control signals of such systems have spectral components ranging from D.C. to above the sampling frequency so that the systems may have acceptable performance for coding transient signals. However, during digital transmission, some individual control bits of such control signals will become much more significant than other bits, so that a small percentage of errors in transmitting the wide band control signals (caused for example by a random or burst error) which happen to hit these critical control bits will cause the received control signals to deviate significantly from their proper values. Because of such errors, the magnitude of the spurious spectral components in the received audio can become very large even if the circuits are perfect.

It is a characteristic of human hearing that spurious spectral information is much less audible if it is close in frequency to the desired audio signal. If the spurious energy lies far from the desired audio signal it is much more likely to be audible.

With an ADM system, the tolerance of the control signal tracking (encoder and decoder) and the multiplier precision can be relaxed somewhat if the spectrum of the control signal is constrained to contain only low frequency information. This is because a low frequency modulating signal produces new frequencies which are close to the original audio frequencies, and we can tolerate some of these new frequencies in the decoded output since they will be masked by the audio signal.

Adaptation with relatively slow control signals is known as syllabic adaptation. A syllabic ADM system is much more appropriate for low cost high quality audio applications for the reasons mentioned above. Such a system is also more resistant to errors in transmission of the control signal since the audible effects will be less. However, reduction of control information bandwidth will cause the step-size control signal to be delayed relative to the analog input signal. Thus, the analog input signal will reach the A-D converter before the converter has completed or even started its adaptation in accordance with the control signal. In a high quality audio system, the bandwidth of the control signal cannot be narrower than a few kHz without causing noticeable or even intolerable distortion in the reproduced audio.

Syllabically adaptive delta modulation modifies the quantizing step-size to accommodate the time derivative or slope of the incoming signal. In an ideal syllabic ADM design, the step-size at each instant will be only slightly greater than the minimum needed thereby giving a minimum quantizing error and the best signal to noise ratio. However, to achieve comparable quality, even an ideal ADM system requires higher bit rates than a PCM system. If the bit rate of an ADM system is reduced to one comparable with that required for a PCM system, the noise modulation is unacceptable. The audibility of noise modulation accompanying low and middle frequency audio signals can be reduced by the use of fixed pre-emphasis and de-emphasis. However, this is done only at the expense of increased noise modulation when the audio signal contains significant high frequencies. The increased noise modulation is particularly disturbing for low frequency noise in the presence of predominantly high frequency signals.

Conventional syllabically adaptive delta mdoulation systems with limited adapting bandwidth (slow response time) suffer from transient distortion. Because of the limited adapting bandwidth the system is in slope overload during the time required to respond to a sudden increase in signal level. While ADM systems which suffer brief transient distortions may be acceptable for communication purposes since speech intelligibility may be unaffected, such distortions cannot be tolerated for many applications, such as high quality audio.

SUMMARY OF THE INVENTION

Many of the above described difficulties or disadvantages are alleviated in the present invention. The system of the invention is not subject to transient distortion. The effects of noise modulation are reduced compared with conventionl ADM systems. The effect of uncorrected errors in step-size transmission is also reduced.

The invention is directed to an encoder and a decoder system. The encoder of this invention converts an analog input signal to a digital signal. The encoder comprises means for generating a control signal with a predetermined bandwidth from the input analog signal. The control signal indicates the desired optimum step-size to be applied in the encoder. The encoder further comprises a converter for converting the analog input signal to a digital signal. The converter is responsive to the control signal representing step-size so that the digital signal will be generated in accordance with the step-size information. The encoder also includes means for introducing time delay to the analog input signal before the signal reaches the converter to compensate for the time required in order for the deriving means to derive the control signal with predetermined bandwidth.

The decoder of this invention generates an analog output signal from a digital signal received from the encoder of the type described above through a transmission medium where the digital signal received has been derived from an input analog signal in the encoder in the manner described.

In another aspect, the decoder decodes a digital signal received from an encoder through a transmission medium where the digital signal includes the digital representation of an analog signal and step-size information, and the analog signal has been encoded in the encoder in accordance with the step-size information. In one embodiment, the decoder comprises means for bandwidth limiting the step-size information and converter means responsive to the digital representation of the analog signal and the bandwidth limited step-size information for generating an analog output signal. In a second embodiment, the decoder decodes the digital signal which is generated by the encoder in such a manner that the step-size information is received by the decoder in advance of the corresponding digital representation of the analog signal by a predetermined and substantially fixed time interval. In the second embodiment, the decoder comprises a converter responsive to the digital representation of the analog signal and the corresponding step-size information for generating an analog output signal.

BRIEF DESCRIPTION OF THE DRAWINGS

FIG. 1 is a graphical illustration of the noise and distortion emerging from an ADM coder-decoder as a function of the step-size applied by the coder-decoder.

FIG. 2A is a block diagram for an encoder illustrating an embodiment of this invention.

FIG. 2B is a block embodiment of this invention.

FIGS. 3A and 3B are graphical illustrations of respectively the pre-emphasis characteristics of the pre-processing circuit of FIG. 2A and the de-emphasis characteristics of the post-processing circuit of FIG. 2B.

FIG. 4 is a block diagram illustrating the preferred embodiment for a portion of the encoder of FIG. 2A.

FIG. 5 is a block diagram of a decoder containing the system definition of the decoder to illustrate the preferred embodiment of the invention.

FIG. 6 is a schematic circuit diagram for the circuit of FIG. 5 to illustrate the invention.

DETAILED DESCRIPTION OF THE PREFERRED EMBODIMENT

The noise and distortion emerging from an ADM encoder-decoder system (codec) depend on the audio input signal and the step-size, both of which are varying. Consider a codec handling a single sine wave. As a function of step-size, the output noise and distortion will vary as shown qualitatively in FIG. 1. In the region labelled A, the step-size is too large, which produces excessive quantizing noise. In region B the step-size is too small and the system is in overload which produces high noise and distortion. There is an optimum value of step-size for the particular input condition labelled C. For each short time segment of real audio there is a curve like that of FIG. 1, and an optimum step-size. In a conventional output controlled ADM system the step-size rarely achieves the optimum value, but remains in region A most of the time, moving into region B on signal transient. The object of this invention is to design an ADM system that operates as much as possible in region C, and that operates so that the delta modulator is fully loaded. This is possible because the step-size determination is done in the encoder and is input controlled as explained below.

FIG. 2A is a block diagram for an encoder illustrating an embodiment of this invention. As shown in FIG. 2A, an analog audio input signal 12 is passed through a low-pass filter 14 to determine the overall audio bandwidth of the analog input signal. Typically such bandwidth may be 15 kHz. The analog input signal is then passed through a pre-processing circuit 16 which is the subject of the companion application. The function of the pre-processing circuit 16 will be discussed below.

After being pre-processed the analog audio input signal is supplied to a step-size derivation circuit 18 and to a delay circuit 20. In one particular application the step-size derivation circuit 18 comprises a slope detector for detecting the time derivative or slope of the incoming audio input signal. The slope detector then generates a control signal indicative of the step-size to be used in the adaptive delta modulator 22. The control signal is limited by a bandwidth limitation circuit 24 and then applied to the adaptive delta modulator 22. A-D converter 26 converts the step-size control signal into a bit-stream of digital signals to convey step-size information. After being time delayed by delay circuit 20 the audio input signal is converted into a bit-stream of digital audio signals by adaptive delta modulator 22 in accordance with the step-size indicated by the bandwidth limited step-size control signal 45. The audio bit-stream and the step-size information bit-stream are then transmitted through a medium to a decoder which is shown in FIG. 2B. In one particular application encoder 10 is part of a broadcasting station transmitting the audio and step-size information bit-streams to decoders in consumer systems. The function of delay circuit 20 and bandwidth limitation circuit 24 will be discussed after a brief description of the decoder of FIG. 2B below.

FIG. 2B is a block diagram of a decoder illustrating the preferred embodiment of this invention. As shown in FIG. 2B decoder 40 comprises an adaptive delta demodulator 42 for receiving the digital audio bit-stream 30 transmitted through the medium and a D-A converter 44 for receiving the digital step-size information bit-stream 28. D-A converter 44 converts the digital bit-stream into an analog step-size control signal which is supplied to bandwidth limitation circuit 46. After being limited in bandwidth, the step-size control signal is applied to adaptive delta demodulator 42. Adaptive delta demodulator 42 generates an analog audio output signal from the audio bit-stream in accordance with bandwidth limited step-size control signal from bandwidth limitation 46. Bandwidth limitation circuit 24 of FIG. 2A limits the bandwidth of the step-size control signal applied to adaptive delta-modulator 22 so that the step-size cannot change abruptly from one sample to the next. Similarly, bandwidth limitation circuit 46 limits the bandwidth of the step-size control signal applied to adaptive delta-demodulator 42. Thus if the transmission medium introduces a bit error in the step-size information bit-stream, such an error, after being converted into analog form by D-A converter 44, cannot introduce a major error in the step-size at adaptive delta demodulator 42. The effect of transmission errors is thereby reduced. Therefore, cheap non-precision components may be used to construct the converters 26, 44 and the transmission of the step-size information bit-stream is highly tolerant of bit errors.

The generation of a limited bandwidth step-size control signal will require a finite time. To compensate for such time, delay circuit 20 introduces a time delay so that the pre-processed analog audio input signal will reach adaptive delta modulator 22 at a time when the step-size control signal for such input signal is available from bandwidth limitation circuit 24. This is particularly advantageous when there are sudden changes in the slope of the input audio signal.

While in FIGS. 2A and 2B the step-size information bit-stream 28 and audio bit-stream 30 are shown as being transmitted separately, it will be understood that the two bit-streams may be transmitted together in one single channel provided that the two bit-streams can be distinguished from each other. All three bit-streams 28, 30 and 82 may be transmitted in the same channel instead of in separate channels if they can be distinguished from each other.

By introducing a time delay through delay circuit 20 that also compensates for the time delay caused by the bandwidth limitation circuit 46 in the decoder, the audio bit-stream signals which are the digital representation of a particular analog signal reach the delta demodulator when the bandwidth limited step-size control signal is available from circuit 46. In such manner, the need for a delay circuit in the decoder to compensate for the time delay caused by the bandwidth limiting of the step-size control signal in the decoder is eliminated and the decoder circuit is simplified. This is particularly advantageous for lowering the cost of consumer decoder equipment.

The following discussion on the preprocessing circuit 16 and other associated circuit components is taken from the companion application entitled "Spectral Emphasis and De-emphasis" by Kenneth Gundry and Craig Todd. Since the step-size in the A-D and D-A conversions is variable, the noise amplitude will be modulated depending on the step-size and such noise modulation is undesirable in many applications such as in high quality audio equipment. To reduce noise modulation the above referenced application by Kenneth Gundry and Craig Todd discloses a technique embodied by pre-processing circuit 16 and post-processing circuit 96, combined with circuit components A-D converter 72 and digital delay 74 of FIG. 2A. The pre-processing circuit 16 comprises spectral analysis circuit 52, bandwidth limitation circuit 54, adaptive pre-emphasis circuit 56, and delay circuit 58, all of FIG. 2A. The post-processing circuit 96 comprises D-A converter 76, adaptive de-emphasis circuit 78 and bandwidth limitation circuit 80, all of FIG. 2B.

Spectral analysis circuit 52 analyzes the audio input signal to generate an emphasis control signal. The emphasis control signal generated is a function only of the spectrum of the input audio and is substantially independent of the amplitude of the input audio. The emphasis control signal is then limited by bandwidth limitation circuit 54 and applied to adaptive pre-emphasis circuit 56. Adaptive pre-emphasis circuit 56 boosts or boosts and bucks the different frequency components of the input audio signal by amounts which are functions of the emphasis control signal. The emphasis control signal is limited in bandwidth so that the frequency response of the adaptive pre-emphasis circuit 56 will not change suddenly from sample to sample. Bandwidth limitation circuit 80 reduces the effect of bit errors introduced by the transmission medium in a manner similar to bandwidth limitation circuit 46 described above.

In reference to FIGS. 2A, 2B, delay circuit 58 introduces a time delay which permits the pre-emphasis circuit 56 to complete its adaptation before the audio input signal is supplied to the pre-emphasis circuit 56. The pre-processed audio input signal is supplied to delay circuit 20 and adaptive delta modulator 22 as described above. The emphasis control signal from spectral analysis circuit 52 is converted into a digital bit-stream carrying spectral information by A-D converter 72 and is delayed by digital delay 74 by a time period substantially equal to that of delay circuit 20.

Comparing the timing relationship of the audio and the spectral information bit-streams, an audio signal in the audio bit-stream has been delayed by delay circuits 58, 20, whereas the corresponding spectral information signal for such audio signal has been delayed by only the digital delay 74. Thus the net effect is that the audio is delayed relative to the corresponding spectral information by the time delay caused by delay 58, so that the spectral information reaches the decoder of FIG. 2B and the post-processing circuit 96 in advance of the corresponding audio signals and at the proper time to change the amplitudes of the various frequency components of the audio signal in a manner complementary to that of the adaptive pre-emphasis circuit 56. The further requirements for complementarity are discussed below. The time delay introduced in the encoder by circuit 58 compensates for the time delay caused by bandwidth limiting the spectral information in bandwidth limitation circuit 80 in the decoder.

If the audio and the corresponding spectral information were synchronous so that they reached the decoder and the post-processing circuit at the same time, the time delay caused by bandwidth limitation circuit 80 would cause the audio to reach the adaptive de-emphasis 78 before the bandwidth limited de-emphasis control signal was available for controlling the de-emphasis. A delay circuit would then be required in the decoder to delay the audio so that the audio would reach the de-emphasis 78 at the appropriate time. By introducing a timing discrepancy between the audio and the corresponding spectral information in the encoder in the manner discussed above, the need for a delay circuit in the decoder equipment is eliminated and the cost of the decoder is reduced.

One of the purposes of the encoder-decoder system of FIGS. 2A and 2B is to transmit an analog audio signal through a medium so that the analog audio output signal recovered after the transmission is substantially the same as the input audio. To accomplish this purpose, the adaptive delta modulator 22 in the encoder of FIG. 2A and the adaptive delta demodulator 42 are substantially complementary to each other. In addition, the step-size control signals applied to the modulator 22 and demodulator 42 are substantially the same and are applied to the modulator and demodulator with substantially the same timing relationship with respect to the corresponding audio signals so that the modulation and demodulation applied are complementary. In other words, if the step-size control signal for an audio signal is applied at a time t before or after the audio signal reaches the modulator 22, the step-size control signal should reach the demodulator 42 also at substantially time t before or after the audio signal reaches the demodulator. This assures that the modulation and demodulation applied are substantially complementary. Similarly, the pre-processing and post-processing circuits are also substantially complementary to each other; the emphasis and de-emphasis control signals are substantially the same and have substantially the same timing relationship with respect to the audio for the application of pre-emphasis and de-emphasis so that the pre-emphasis and de-emphasis applied are substantially complementary.

After the above requirements for complementarity are generally met, however, the encoder-decoder system is highly tolerant of timing errors. Since the step-size, pre-emphasis and de-emphasis control signals can only change slowly in the encoder and decoder, the adaptive modulation and demodulation together with the pre-emphasis and de-emphasis applied by the encoder and decoder can only change slowly. Thus mismatch in timing relationship of the type explained above and of the order of a few percent of the bandwidth limitation rise times will not cause the modulation and demodulation to deviate significantly from being complementary. Similarly mismatch in timing relationship of such order of magnitude will not cause the pre-emphasis and de-emphasis applied to deviate significantly from being complementary.

The characteristics of adaptive pre-emphasis and de-emphasis circuits 56, 78 are illustrated in FIGS. 3A, 3B. It will be understood that the specific frequencies and gains in FIGS. 3A, 3B and in the discussion below are for illustrative purposes only and that the characteristics of circuits 56, 78 are not limited thereby. In some respects, the pre-emphasis and de-emphasis characteristics are similar to the well known type of "sliding band" circuits, which reduce high frequency noise by way of a filter with a variable corner frequency. As the signal level increases, the filter corner frequencies of such "sliding band" circuits slide continuously and upwardly to narrow the band boosted and cut. Examples of such circuits are found in U.S. Pat. No. 4,072,914 and U.S. Pat. No. 3,934,190.

The pre-emphasis characteristic of circuit 56 also has a variable frequency indicated at 86a, 88a, 90a, 92a, 94a and 96a of the pre-emphasis characteristic curves 86, 88, 90, 92, 94 and 96 respectively of FIG. 3A. The de-emphasis curves 84'–96' of FIG. 3B are complementary to curves 84–96 respectively and also have variable frequencies 86a'–96a'. Such variable frequencies also continuously shift as a function of the input audio. However, unlike the "sliding band" circuits, the continuous shifting is determined, not by the level of high frequency signals but by the spectral content of the input audio in a manner described below. In the above referenced "sliding band" circuits, the signal components with frequencies higher than the variable corner frequency are boosted (or cut) and those with frequencies lower than the corner frequency remain unchanged. While signals with frequencies higher than the variable frequency are also boosted by circuit 56 as shown in FIG. 3A, for each of curves 90 through 96, there is a spectral region in which signals are bucked. Similarly there is a spectral region for each of de-emphasis curves 90'–96' in which signals are boosted. The detailed characteristics of circuit 56 are described below.

It is assumed first, for the purpose of discussion, that the predominant signal components of the input audio are concentrated in a certain region of the frequency spectrum. When the audio input signal comprises mostly low and middle frequency energy e.g. concentrated in the frequency region below 500 Hz, adaptive pre-emphasis circuit 56 adopts the response labelled 84, boosting only signals with frequencies above 500 Hz; the predominant signals with frequencies below 500 Hz remain substantially unchanged. When the audio signal from the adaptive delta-demodulator 42 reaches adaptive de-emphasis circuit 78 the high frequency components of the quantizing noise will be reduced by adaptive de-emphasis circuit 78 which will have a characteristic 84' complementary to curve 84 as shown in FIGS. 3A and 3B. High frequency noise above 500 Hz is thereby reduced sufficiently that audible noise modulation becomes much diminished. Low and medium frequency noise below 500 Hz is masked by the signal.

As the frequency of the input audio signal rises so that the predominant signal components are concentrated between about 500 Hz and 2 kHz, the emphasis control signal from the spectral analysis circuit 52 causes the frequency response of adaptive pre-emphasis circuit 56 to slide from 84 to 86 or 88. Such dynamic action of the adaptive pre-emphasis circuit prevents undesirable increases in the step-size of the adaptive delta-modulator but still allows the subsequent complementary de-emphasis to reduce noise at frequencies above those of the input signal. Low frequency noise is not yet an audible problem.

The frequency responses of the shape 84, 86, 88 (that is, sliding high frequency boost) are satisfactory for noise reduction when the predominant spectral components of the input audio signal are below 2 or 3 kHz. Noise at frequencies above these predominant spectral components is reduced as described above; lower frequency noise is masked by the signal. When the predominant spectral components of the input audio signal are at high frequencies (e.g. above 3 kHz) such sliding boost responses may no longer be satisfactory for noise reduction, since low and medium frequency noise is no longer masked by the signal. Under these signal conditions the effect of high frequency boost would be to increase the step-size employed in the adaptive delta modulator 22 and demodulator 42, resulting in an increase in wide-band quantizing noise. The subsequent complementary high frequency cut would not reduce the low frequency part of this increased noise. Thus low frequency noise would be modulated by changes in the high frequency components of the input audio signal. Under such conditions, it is desirable to convert the high frequency boost of adaptive pre-emphasis circuit 56 for the spectral region where the predominant signal components of the input audio are concentrated into a cut such as the dips shown as portions 90b, 92b, 94b, 96b of respective curves 90, 92, 94 and 96 in FIG. 3A. Therefore, as the frequencies of the predominant spectral components of the input audio signal rise, the frequency response of adaptive emphasis circuit 56 will slide past the curves 84, 86 and 88 to curves 90, 92, 94 and 96.

When the predominant signal components are concentrated in high frequencies such as around 5 kHz, high frequency noise around 5 kHz is masked. Noise at still higher frequencies may not be masked and it may be desirable to reduce such noise while also reducing low frequency noise in the manner described above. Thus the curves 90, 92, 94 and 96 at frequencies above the variable frequency retain the shape of a high frequency shelf. The complementary de-emphasis curves 84'–96' corresponding to respective pre-emphasis curves 84–96 are shown in FIG. 3B, and have variable frequencies 86a'–96a' which are substantially the same as those of the pre-emphasis curves. De-emphasis curves 90'–96' have peaks 90b'–96b' corresponding to dips 90b–96b of the pre-emphasis curves of FIG. 3A.

The overall effect of the curves 90–96 can now be described. Pre-emphasis curves with dips at the spectral regions of the predominant signal components will reduce the step-size and hence the broad-band noise emerging from the encoder-decoder system. The subsequent de-emphasis peaks 90b', 92b', 94b' and 96b' will pick out the wanted predominant signal components and restore them to their original amplitudes. The de-emphasis will also buck the signals at frequencies above the variable frequencies to reduce very high frequency noise. Thus the reduced low frequency noise level is retained, high frequency noise is masked and very high frequency noise is reduced.

In the above discussion, it has been assumed that the predominant signal components of the input audio are concentrated in a certain region of the frequency spectrum. Such an input signal is in fact the most critical case. When the signal spectral components are more distributed, their masking properties cover more of the noise, and the shapes of the pre-emphasis curves are less critical. If the signal spectral components are distributed in two regions of the frequency spectrum, the pre-emphasis curves will resemble the curve for the case where the spectral components are concentrated in a region between such two regions.

Bandwidth limitation circuits 24, 46, 54 and 80 limit the step-size and spectral control signals to within bandwidths of a few tens or low hundreds of Hz; hence the control signals can have rise times of a few milliseconds. The delay introduced by delay circuits 20, 58 is therefore chosen to be substantially equal to the rise times of the control signals as determined by the bandwidth limiting. Suitable values are in the range 5 to 20 milliseconds. The control A-D and D-A converters 26, 44, 72 and 76 may be simple delta or delta-sigma modulators and demodulators operating at a few kilobits per second. In television sound applications a convenient value is half the horizontal frequency, about 7.8 kHz.

For convenience in instrumentation and better tracking between encoder and decoder, the signal entering bandwidth limitation 24 in the encoder 10 may be derived from the information bit-stream 28 instead of the output of step-size derivation 18. Such a configuration is illustrated in FIG. 4, with adaptive delta modulator 22, limitation circuit 24 and A-D converter 26 rearranged as shown. A local D-A converter 100 converts the digital step-size information bit-stream 28 into an analog step-size control signal. In reference to FIG. 4, where the A-D converter 26 uses delta-sigma modulation and the local D-A converter 100 is already contained within the A-D converter, no extra local D-A converter 100 will be necessary. Similarly the spectral analysis information supplied to adaptive pre-emphasis circuit 56 may be derived from the spectral information bit-stream 82 before delay is introduced by delay circuit 74. This is again advantageous if A-D converter 72 uses delta-sigma modulation.

Instead of using a bandwidth limiting circuit 46 for limiting the bandwidth of step-size control signal applied to the adaptive delta-demodulator, D-A converter 44 may contain the bandwidth limitation. Similarly, bandwidth limitation circuit 80 may be eliminated if D-A converter 76 is similarly bandwidth limited.

Since it is desirable that the effect of a bit error should be a gain error of similar logarithmic magnitude for both large and small step-sizes, it is preferable to design the A-D converter 26 and D-A converter 44 so that the digital bit-stream 28 conveys the logarithm of the step-size. Similarly, the spectral information bit-stream preferably conveys the logarithm of the spectral information. In embodiments in which logarithmic and exponential circuits are inconvenient, it may be more practical to convey some other non-linear function of the step-size, such as the square root or the cube-root; such functions will not give perfectly uniform gain errors over the dynamic range of the system, but the extent of the variation will be much less than that resulting from a linear function.

For the same reasons discussed above for transmission of audio information, it is desirable to design an encoder-decoder system which conveys step-size information and spectral information at low bit rates of transmission and which can be implemented at low cost. In choosing the scheme for A-D and D-A conversion for converters 26, 44, 72 and 76 it is desirable to choose one that allows a low bit rate for the transmission of step-size information. Preferably, such bit rate is small compared to the bit rate for transmission of audio data. The A-D or D-A conversion performed in converters 26, 72 and 44, 76 can be one of many schemes, including PCM, delta modulation or delta-sigma modulation. While a PCM system requires a low bit rate, expensive converters must be used so that it is undesirable to use PCM in the converters. Delta-sigma modulation requires a somewhat higher bit rate (on the order of 5 to 10 kbit/sec) than PCM but it can be implemented simply and at low cost. Furthermore, the bit rate required for delta-sigma modulation is still low cmpared with the bit rate for the transmission of audio data (on the order of 200 to 300 kbit/sec). Therefore, delta-sigma modulation is used in the preferred embodiment discussed below. A description of delta-sigma modulation can be found in *Delta Modulation Systems,* Pentech Press Limited, London, 1975 by Raymond Steele.

FIG. 5 is a block diagram for a decoder system illustrating the preferred embodiment of the invention; the characteristics of most of the circuit blocks are defined for the system in FIG. 5. The system is particularly suitable for consumer use. The adaptive delta demodulator or audio decoder 42 comprises a pulse height modulator 202 and a leaky integrator 204. Pulse height modulator 202 multiplies the step-size control signal Vss by +1 or −1 in accordance with the audio data bit stream, and supplies the result to the leaky integrator 204. The leak time constant may be approximately 0.5 milliseconds which corresponds to a cut-off frequency of approximately 300 Hz. The integrator integrates the resulting signal to produce an analog audio signal. At frequencies below the frequency corresponding to the leak time constant, the system is strictly not delta but delta-sigma modulation.

In reference to FIG. 2A, the adaptive delta modulator 22 also includes a leaky integrator (not shown) with a cut-off frequency which is about the same as the one in the decoder. The step-size derivation means 18 may be a slope detector which responds to the pre-processed input audio signal by deriving a control signal indicative of the slopes of the signal components of the audio input with frequencies above the cut-off frequency and the amplitudes of the signal components with frequencies below the cut-off frequency.

In the preferred embodiment, the step-size or slope date are transmitted by delta-sigma modulation and in the form of the logarithm of the required step-size or slope. The slope data are therefore decoded in the slope decoder 205 by passage through a low pass filter 206 (corresponding to D-A converter 44 and bandwidth limitation 46 of FIG. 2B), which determines the bandwidth (and hence the rise-time) and ripple of the slope voltage. In the preferred embodiment, a 3-pole low pass filter is employed which causes the step-size control signal Vss to have a rise time of about 10 milliseconds corresponding to a bandwidth of about 50 Hz. The slope voltage is then applied to an exponentiator 208 or anti-log. circuit, which may be, for example, a bipolar transistor. If the normalized mean level of the bit stream (or the duty-cycle measured over the rise-time of the low pass filter) is written as y, then $$Vss = Vo \exp ky$$

where Vo and k are constants suitable for the particular implementation.

If a practical value of k is 10 ln 2, this definition gives an increase of 6 dB in step-size for every increase of 0.1 in y. Since y is confined to a range of 0 to 1, the resultant maximum possible range of Vss is 60 dB.

The transmission of slope information in logarithm form reduces the dynamic range conveyed in the slope data bit-stream from about 50 dB to about 19 dB, and spreads the effect of bit errors more uniformly across the dynamic range. Since Vss is confined by the low pass filter 206 to a bandwidth of about 50 Hz, bit errors lead to slow random amplitude modulation of the output audio. The audible disturbance produced by errors in the slope data bit-stream may be negligible. It has been observed that uncorrected bit error rates of up to 1 in 100 or so produce nearly imperceptible disturbance of music or speech.

The low pass filter thus converts the digital slope data into analog data and limits its bandwidth. Low pass filter 206 therefore performs both the functions of both the D-A converter 44 and bandwidth limitation 46 of FIG. 2B. In reference to FIGS. 2A, 2B and 5, delay means 20 introduces such delay that the slope data are received by filter 206 before the corresponding audio data are received by the pulse height modulator 202. Such time difference compensates for the rise time of about 10 milliseconds of Vss. In such manner, the need for a delay circuit in the decoder is eliminated.

FIG. 3B illustrates a set of de-emphasis curves which are complementary to those of the pre-emphasis curves of FIG. 3A. There are many ways to synthesize responses of this nature. The sliding band de-emphasis 78 defined in FIG. 5 shows one practical implementation of the de-emphasis characteristic. The system definitions for all the circuit blocks in FIG. 5 together with one set of values of the constants giving satisfactory results are listed below:

leaky integrator 204 $\dfrac{1}{1 + sT_o}$ 3-pole L.P. filter 206, 214 $\left(\dfrac{1}{1 + sT_4}\right)^3$ exponentiator 208 (slope decoder) $V_o \exp ky$ exponentiator 216 (spectrum data) $f_o \exp kx$ sliding band de-emphasis 78 $\left[\dfrac{10sT_1}{1 + sT_1} + \dfrac{1 + sT_2}{1 + sT_3}\right]^{-1}$ fixed de-emphasis 118 $\dfrac{1}{1 + sT_5}$ s is the complex frequency $T_o = 0.5$ milliseconds $T_1$ is variable so that the variable frequency of the sliding band de-emphasis $f_1$ is given by:

$$f_1 = 1/(2\pi T_1) = f_o \exp kx$$

$T_2 = 5$ microseconds
$T_3 = 50$ microseconds
$T_4 = 2$ milliseconds
$T_5 = 25$ microseconds
$f_o = 4$ kHz $V_o$ is scaling factor to suit the design of the audio decoder.

x and y are the normalized mean levels of their respective bit-streams, i.e. the proportion of 1's measured over the smoothing time of the 3-pole L.P. filter.

$k = 10 \ln 2 = 6.93$

The spectrum decoder 212 comprising 3-pole filter 214 and exponentiator 216 is substantially the same as the slope decoder. It finds the normalized mean level x of the spectrum data input which conveys the logarithm of the variable frequency of the desired sliding band de-emphasis $f_1$ defined above, $f_1$ being different from the variable frequencies 86a–96a, 86a'–96a' of FIGS. 3A, 3B. The spectrum decoder generates the exponent or anti-log. of the mean level and applies the resulting voltage or current to the sliding band de-emphasis 78. The emphasis control signal is even less affected by bit errors in transmission than the slope data control signal.

In delta modulation systems the sampling frequency is vastly greater than the minimum required by information theory. Non-audio spectral components in the output are at frequencies well above the audio band and only an elementary low pass filter such as filter 118 is necessary.

FIG. 6 is a schematic circuit diagram showing a possible implementation of the system of FIG. 5. As shown in FIG. 6, the sliding band de-emphasis circuit 78 employs a main path 78a with fixed characteristics in parallel with a further path 78b with variable characteristics. The variable characteristics of the further path are controlled by the resistance of a variable resistance 252, which in turn is controlled by the emphasis control signal from spectrum decoder 212. There is no systematic compression or expansion of the dynamic range; the further path is controlled ultimately by the spectrum of the input audio.

In reference to FIG. 2B, by limiting the bandwidths of the step-size and emphasis control signals, the characteristics of the delta demodulator 42 and de-emphasis 78 can only change slowly. Because they have slowly changing characteristics, the delta demodulator and de-emphasis are thereby rendered linear or quasi-linear. It makes little difference whether the demodulation is performed ahead of the de-emphasis or vice versa. This linear or quasi-linear feature of the decoder system is even clearer in the case of the preferred embodiment in FIG. 5. Four processes are performed on the audio bit stream: pulse height modulation, leaky integration, sliding band de-emphasis and fixed de-emphasis. All four are linear or quasi-linear processes so that they can be performed in any order.

In FIG. 5, the pulse height modulator 202 can be a relatively simple circuit since it is required only to switch the sign of voltage Vss depending on the state of the audio bit-stream. Thus the modulator 202 may be made at low cost for consumer decoders. However, multiplying the audio data by the step-size control signal at a different point, say after sliding band de-emphasis but before fixed de-emphasis, may have the advantage that quality of the audio output is improved. This may be desirable for applications such as in broadcast stations and other professional equipment. While the multiplication will have to be performed by a circuit more complex and therefore costlier than the type of pulse height modulator adequate for the arrangement of FIG. 5, the improvement in quality for professional applications may be well worth the additional cost. Multiplying the audio data at a different point is permissible because the four processes are effectively linear as explained above. All such possible arrangements of the four processes are within the scope of this invention.

Instead of using a single 3-pole filter in the slope and spectrum decoders 205, 212, it is possible to use a two pole filter instead if an additional single pole filter is used to filter the output of exponentiators 208, 216. Thus the filtering can be split into two steps: one before the exponentiation and the other one after. Any arrangement of filters may be used as long as the filter for filtering the slope or spectrum data before the exponentiation restricts the ripple in the filter output to a few percent of its mean value.

This invention together with the invention of the companion application referenced above reduce the transmission bit rate of the audio bit-stream to that comparable with or somewhat less than the bit rate required for a companded PCM system with comparable performance. The transmission bit rates for the encoder-decoder system of this invention may be in the region of 200 or 300 kbit per second. The transmission of spectral and step-size information may require about 10 or 20 kbit per second and does not add significantly to the total transmission bit rate required for the encoder-decoder system of this invention. The encoder-decoder system of FIGS. 2A and 2B, however, retains the advantages of delta modulation systems. The invention reduces and in many applications eliminates disturbing effects of bit errors. It and its components have high tolerance of errors. The receiving equipment (decoder) is inexpensive. The system is efficient in usage of channel capacity so that more excess capacity will exist for flexibility to add additional channels or more bandwidth will be available to other signals such as video signals. The transmission equipment (encoder) does not require special attention or require the use of non-complementary signal processing.

It will be apparent to those skilled in the art that the principles described herein are applicable not only to adaptive delta-modulation, but to other adaptive A-D and D-A coding systems, such as delta-sigma modulation, double integration delta-modulation, and PCM systems with variable reference voltages.

While the invention has been described for the processing and transmission of audio signals, it will be understood that it may be used for the processing and transmission of other signals as well. The above description of circuit implementation and method is merely illustrative thereof and various changes in arrangements or other details of the method and implementation may be within the scope of the appended claims.

We claim:

1. An encoder for converting an analog input signal to a digital signal comprising:
    means for deriving, from the analog input signal, a control signal indicative of a desired step-size, wherein said control signal deriving means includes a bandwidth limitation circuit for limiting the bandwidth of the control signal, causing the control signal to have substantially a selected rise time;
a first converter for converting said analog input signal to a digital signal, said converter responsive to said bandwidth limited control signal so that the digital signal will be generated in accordance with the desired step-size; and
means for introducing time delay to said analog input signal before it reaches the first converter to compensate for the rise time of said control signal.

2. The encoder of claim 1 wherein the control signal deriving means indicates the step-size required for minimum quantizing error in the first converter.

3. The encoder of claims 1 or 2, wherein the converter is an adaptive delta modulator.

4. The encoder of claim 3, wherein said adaptive delta modulator includes a leaky integrator with a cut-off frequency.

5. The encoder of claim 4, wherein said cut-off frequency is of the order of 300 Hz.

6. The encoder of claim 4 wherein the control signal deriving means is a slope detector which derives the control signal from the slopes of the signal components of the analog input signal with frequencies above the cut-off frequency and from the amplitudes of the signal components of the analog input signal with frequencies below the cut-off frequency.

7. The encoder of claim 1, wherein the control signal deriving means is a slope detector.

8. The encoder of claim 1 further comprising a second A-D converter for converting said control signal into a digital step-size information bit-stream suitable for a medium, said bit-stream being and remaining distinguishable from the digital signal when the bit-stream and the digital signal are subjected to the medium.

9. The encoder of claim 8 wherein the second A-D converter includes a D-A converter which converts said digital step-size information bit stream into an analog control signal, and wherein said first converter is responsive to said control signal in analog form derived from the step-size information bit stream.

10. The encoder of claims 8 or 9 wherein said digital step-size information bit-stream conveys a non-linear function of the desired step-size.

11. The encoder of claim 10 wherein said non-linear function is logarithmic.

12. The encoder of claim 10 wherein said non-linear function is square-root.

13. The encoder of claim 10 wherein said non-linear function is cube-root.

14. The encoder of claims 8, 11, 12 or 13 wherein said second A-D converter is a delta-sigma modulator.

15. An encoder-decoder system for converting an analog input signal to a digital signal and for generating an analog output signal from the digital signal wherein said analog output signal is similar to said analog input signal, said system comprising:
means for deriving, from the analog input signal, a first control signal with a selected rise time and indicative of the desired step-size;
a first converter for converting said analog input signal to the digital signal, said converter responsive to said first control signal so that the digital signal will be generated in accordance with the desired step-size;
means for introducing time delay to said analog input signal before it reaches the first converter to compensate for the rise time of the first control signal;
means for deriving a second control signal from the first control signal so that the second control signal is substantially similar to the first control signal; and
a second converter responsive to the second control signal for generating from said digital signal the analog output signal.

16. The encoder-decoder system of claim 15 wherein said first and second control signals are in analog form, said system further comprising:
means for converting said first control signal into a step-size information bit-stream suitable for a medium; and
means for converging said step-size information bit-stream into said second control signal.

17. The system of claim 15 wherein the control signals generated indicate the step-size required for minimum quantizing error in the encoder.

18. The system of claims 15 or 17, wherein said second converter receives said digital signal through a medium, said system further comprising a bandwidth limitation circuit for limiting the bandwidth of said second control signal to reduce the effects of errors introduced by the medium or by the conversions in the encoder or decoder.

19. The system of claims 15 or 17, wherein the second control signal is derived from a step-size information bit-stream which is in turn derived from the first control signal, and wherein said step-size information bit-stream is suitable for a medium.

20. A decoder for generating an analog output signal from a digital signal received from an encoder through a medium, the digital signal including a digital representation of an analog input signal and step-size information wherein said analog input signal has been encoded in the encoder in accordance with the step-size information to provide said digital representation and wherein the step-size information is received by the decoder in advance of the corresponding digital representation of the analog signal by a predetermined and substantially fixed time interval, said decoder comprising:
means for bandwidth limiting said step-size information; and
a converter for converting said digital representation of an analog input signal into an output analog signal in response to the corresponding bandwidth limited step-size information, wherein said substantially fixed time interval compensates for the rise time of the bandwidth limiting means so that the bandwidth limited step-size information is available to the converter when the corresponding digital representation arrives at the converter, and wherein the effects of errors introduced by the medium are reduced.

21. The decoder of claim 20, wherein the input analog signal has been encoded in the encoder in accordance with the step-size information and in response to an encoding step-size control signal and wherein the converter is responsive to the bandwidth limited step-size information in the form of a decoding step-size control signal derived from the encoding step-size control signal, and wherein the time interval has such magnitude that said decoding step-size control signal of limited bandwidth and the digital representation have a timing relationship substantially the same as that between said encoding step-size control signal and said analog input signal so that the decoding is substantially complementary to the encoding.

22. A decoder according to claim 20, wherein the bandwidth limiting means limits the step-size information to such bandwidth that said converter has substantially linear characteristics.

23. A decoder according to claim 20, wherein the bandwidth limiting means has a rise time which is substantially in the range of 5 to 20 milliseconds.

24. The decoder of claim 20, wherein said bandwidth limiting means includes a step-size information decoder for generating a step-size control signal from the step-size information, said step-size information decoder including a low pass filter for limiting the bandwidth of the step-size control signal.

25. The decoder of claim 24, wherein said low pass filter comprises three single pole filters each with a time constant of about 2 milliseconds.

26. The decoder of claim 24, wherein said step-size information is in the form of the logarithm of the slope of the analog input signal, said decoder further comprising an exponentiator for generating a slope control signal from the step-size information.

27. The decoder of claim 26, wherein said low pass filter comprises a single pole filter for filtering the output of the exponentiator and a two pole filter for filtering the step-size information and for applying the filtered step-size information to the exponentiator for generating the slope control signal.

28. The decoder of claim 26, wherein said low pass filter comprises a filter for filtering the step-size information, said filter having such a response that it restricts the ripple in its output to a few percent of its mean level, said filter applying its output to the exponentiator.

29. The decoder of claim 20, wherein said step-size information is received in the decoder in the form of digital signals by delta-sigma modulation and wherein said bandwidth limiting means comprises a low pass filter which also acts to decode the step-size information to generate a limited bandwidth step-size decoding control analog signal.

30. The decoder of claim 20, wherein said digital signal received by the decoder comprises a single bit stream where the digital representation of the analog input signal and the step-size information are received in the bit stream in a manner that allows them to be distinguished from each other.

31. The decoder of claim 20, wherein the digital representation of the analog input signal and the step-size information are received in separate bit streams.

32. A decoder according to claim 20, wherein said converter means comprises an adaptive delta demodulator.

33. The decoder of claim 20, wherein said converter comprises a delta demodulator and means for changing the level of the output analog signal as a function of the step-size control signal, for generating the analog output signal.

34. The decoder of claim 33, wherein the step-size applied by the delta demodulator is substantially fixed and wherein the level changing means applies a variable gain to the output of the delta demodulator to modulate the analog output signal level.

35. The decoder of claim 33, wherein the level changing means adjusts the step-size of the delta demodulator as a function of the step-size information received from the encoder.

36. The decoder of claim 20, wherein said converter includes a leaky integrator and a pulse height modulator responsive to the step-size information to modulate the level of the analog output signal, for generating the analog output signal from the digital representation of the analog input signal.

37. The decoder of claim 36, wherein the leaky integrator has a time constant of about 0.5 milliseconds.

38. A circuit receiving through a medium an input digital signal, a step-size control signal and a spectral control signal, said circuit for converting the input digital signal into an analog signal to provide an output analog signal and for altering the spectral content of said output analog signal, said circuit comprising:
means for limiting the bandwidths of the step-size and spectral control signals;
adaptive delta demodulator means for converting the input digital signal into an analog signal to provide the output analog signal in accordance with the bandwidth limited step-size control signal; and
means for altering the spectral content of the output signal in accordance with the bandwidth limited spectral control signal, said step-size and spectral control signals having such limited bandwidths that substantially the same output signal is obtained irrespective of the order in which the delta demodulation and spectral altering of the input signal are performed.

39. The circuit of claim 38, wherein the delta demodulator comprises a fixed delta demodulator and a gain control which is responsive to the step-size control signal for modulating the level of the output signal, so that substantially the same output signal is obtained irrespective of the order in which three processes are performed: (a) fixed delta demodulation; (b) spectral content alteration and (c) gain control.

40. The circuit of claim 39, further comprising a fixed low pass filter for filtering the output signal, so that substantially the same output signal is obtained irrespective of the order of performing the fixed filtering together with the other three processes.

41. The encoder of claim 1, wherein said deriving means is such that the control signal has a rise time of at least about 1 millisecond.

42. An A-D encoder for use in an encoder-decoder system, said system including a decoder for generating analog output signals from digital signals received through a medium, said decoder also receiving through the medium step-size information related to the digital signals, said decoder comprising first means for bandwidth limiting said step-size information and a D-A converter for converting digital signals received into analog signals in response to the bandwidth limited step-size information related to such digital signals, said encoder comprising:
means for deriving, from an analog input signal, a control signal indicative of a desired step-size;
a first A-D converter for converting said analog input signal to a digital signal, said converter responsive to said control signal so that the digital signal will be generated in accordance with the desired step-size; and
means for introducing time delay to said analog input signal before it reaches the first A-D converter, said time delay being such that the control signal is available to the medium by a substantially fixed time interval before the digital signal is available to the medium;

wherein said substantially fixed time interval compensates for the rise time of the first bandwidth limiting means in the decoder so that the bandwidth limited step-size information is available to the D-A converter in the decoder when the digital signal related to such information arrives at such D-A converter, and wherein the effects of errors introduced by the medium are reduced.

43. The encoder of claim 42 wherein the control signal deriving means indicates the step-size required for minimum quantizing error in the first A-D converter.

44. The encoder of claims 42 or 43, wherein the first A-D converter is an adaptive delta modulator.

45. The encoder of claim 44, wherein said adaptive delta modulator includes a leaky integrator with a cut-off frequency.

46. The encoder of claim 45, wherein said cut-off frequency is of the order of 300 Hz.

47. The encoder of claim 45 wherein the control signal deriving means is a slope detector which derives the control signal from the slopes of the signal components of the analog input signal with frequencies above the cut-off frequency and from the amplitudes of the signal components of the analog input signal with frequencies below the cut off frequency.

48. The encoder of claim 42, wherein the control signal deriving means is a slope detector.

49. The encoder of claim 42 wherein said control signal deriving means includes a bandwidth limitation circuit for limiting the bandwidth of the control signal to a predetermined bandwidth.

50. The encoder of claim 42 further comprising a second A-D converter for converting said control signal into a digital step-size information bit-stream suitable for the medium, said bit-stream being and remaining distinguishable from the digital signal when the bit-stream and the digital signal are subjected to the medium.

51. The encoder of claim 50, wherein the second A-D converter includes a second D-A converter which converts the step-size information bit stream into an analog step-size control signal, and wherein said first A-D converter is responsive to said step-size control signal in analog form derived from the step-size information bit-stream.

52. The encoder of claims 50 or 51 wherein said digital step-size information bit-stream conveys a non-linear function of the desired step-size.

53. The encoder of claim 52 wherein said non-linear function is logarithmic.

54. The encoder of claim 52 wherein said non-linear function is square-root.

55. The encoder of claim 52 wherein said non-linear function is cube-root.

56. The encoder of claims 50, 53, 54 or 55 wherein said second A-D converter is a delta-sigma modulator.

* * * * *

UNITED STATES PATENT AND TRADEMARK OFFICE
CERTIFICATE OF CORRECTION

PATENT NO. : 4,700,362

DATED : Oct. 13, 1987

INVENTOR(S) : Todd et al.

It is certified that error appears in the above-identified patent and that said Letters Patent is hereby corrected as shown below:

Col. 16, line 17: "converging" should be --converting--; and

Col. 19, line 28: "cut off" should be --cut-off--.

Signed and Sealed this

Eighth Day of March, 1988

Attest:

DONALD J. QUIGG

*Attesting Officer*      *Commissioner of Patents and Trademarks*